US006635837B2

(12) United States Patent
Subramanian et al.

(10) Patent No.: US 6,635,837 B2
(45) Date of Patent: Oct. 21, 2003

(54) MEMS MICRO-RELAY WITH COUPLED ELECTROSTATIC AND ELECTROMAGNETIC ACTUATION

(75) Inventors: Arunkumar Subramanian, Minneapolis, MN (US); Susan Bromley, Bloomington, MN (US); Bradley J. Nelson, North Oaks, MN (US); Karl Vollmers, Crystal, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/843,532

(22) Filed: Apr. 26, 2001

(65) Prior Publication Data

US 2002/0160549 A1 Oct. 31, 2002

(51) Int. Cl.7 .......................... B81B 7/00; H01H 59/00; H01H 9/00

(52) U.S. Cl. ........................ 200/181; 361/207; 335/78; 333/262

(58) Field of Search .............................. 200/16 B, 181; 333/101–108, 262; 335/78, 79, 205; 361/207

(56) References Cited

U.S. PATENT DOCUMENTS

| | | | | | |
|---|---|---|---|---|---|
| 3,984,794 | A | * | 10/1976 | Beavitt | 335/154 |
| 4,074,088 | A | * | 2/1978 | Keough et al. | 200/5 A |
| 4,922,070 | A | * | 5/1990 | Dorinski | 200/512 |
| 5,479,042 | A | * | 12/1995 | James et al. | 257/415 |
| 6,054,659 | A | * | 4/2000 | Lee et al. | 200/181 |
| 6,094,116 | A | * | 7/2000 | Tai et al. | 200/181 |
| 6,100,477 | A | * | 8/2000 | Randall et al. | 200/181 |
| 6,376,787 | B1 | * | 4/2002 | Martin et al. | 200/181 |

OTHER PUBLICATIONS

Bosch, D. et al., "A Silicon Microvalve with Combined Electromagnetic/Electrostatic Actuation", *Sensors and Actuators A*, vol. 37–38, pp. 684–692 (1993).

Subramanian, A. et al., "Coupled Electrostatic and Electromagnetic Actuation", *Advanced Microsystems Laboratory*, pp. iii–viii, 9–20 (Oct. 2000).

Cho, H. et al., "A Novel Bi–Directional Magnetic Microactuator Using Electroplated Permanent Magnet Arrays with Vertical Anisotropy", *IEEE*, pp. 686–691 (©2000).

Drake, J. et al., "An Electrostatically Actuated Micro–Relay", *The 8th International Conference on Solid–State Sensors and Actuators, and Eurosensors IX*, vol. 2, Sessions A7–D13, Papers No. 232–496, pp. 380–496, pp. 380–383 (Jun. 25–29,1995).

Zavracky, P. et al., "Micromechanical Switches Fabricated Using Nickel Surface Micromachining", *Jrnl. of Microelectromechanical Systems*, vol. 6, No. 1, pp. 3–9 (Mar. 1997).

* cited by examiner

*Primary Examiner*—J. R. Scott
(74) *Attorney, Agent, or Firm*—Merchant & Gould P.C.

(57) ABSTRACT

A microelectromechanical relay and a method of fabricating the same that combines electrostatic actuation with electromagnetic actuation. The relay has very low contact resistance when the relay is in its ON state and enhanced contact-to-contact isolation when the relay is in its OFF state. The relay includes a substrate having a trench formed therein, a first pair of contacts located in the trench and an actuator for controllably establishing electrical contact between the first pair of contacts. The actuator includes spaced apart supports on the substrate and a movable beam extending between the supports. A contact cross bar is located on the movable beam facing the first pair of contacts. A first electrode is located on the movable beam and a second electrode is located on the substrate. Electromagnetic force is used to deflect the movable beam towards the substrate and then electrostatic force is used to bring the contact cross bar in physical contact with the first pair of contacts.

26 Claims, 8 Drawing Sheets

MEMS MICRO-RELAY WITH COUPLED ELECTROSTATIC AND ELECTROMAGNETIC ACTUATION

BACKGROUND OF THE INVENTION

Microelectromechanical systems (MEMS) have recently been developed as alternatives for conventional electromechanical devices such as relays, actuators, valves and sensors. MEMS fabrication allows the coupling of mechanical and electronic functionality in a single micro-scale device. Borrowing from integrated circuit fabrication, MEMS processes are typically performed on silicon wafers using batch processing techniques. This permits greater economies of scale, higher precision, and better device matching capabilities than conventional assembly-based manufacturing. New functionality may also be provided because MEMS devices are much smaller than conventional electromechanical devices.

One of the components of a mechanical relay is the actuator used to close or open the switch contacts. Common MEMS actuators are driven by electrostatic or electrothermal forces.

D. Bosch et al., "A Silicon Microvalve with Combined Electromagnetic/Electrostatic Actuation," Sensors and Actuators, 37–38 (1993) 684–692, describes a silicon microvalve that uses a combination of electrostatic and electromagnetic actuation. The valve consists of two micromachined components which are then bonded together. Because the two micromachined components are bonded together, increased complexity in assembly is introduced which could lead to errors in alignment of the two parts.

It is desirable to provide a microrelay that has high contact-to-contact isolation when the relay is in the OFF state to increase relay performance. It is also important to provide a microrelay with very low contact resistance and negligible power dissipation when the microrelay is in the ON state to increase relay lifetime and reliability. Also, it is critical to provide a microrelay that requires minimal assembly and lends itself to batch fabrication techniques to reduce product cost. In addition, it is desirable to provide a microrelay that has reduced actuation currents and voltages to reduce device power and lessen heat generation.

SUMMARY OF THE INVENTION

According to a first aspect of the invention, there is provided a microelectromechanical relay. The relay has a substrate layer having a trench formed therein. A first pair of contacts and the bottom electrode are located in the trench of the substrate and a microelectromechanical actuator and contact bar are located on the substrate for controllably establishing electrical contact between the first pair of contacts on the substrate. The actuator includes spaced apart anchors on the substrate, a movable beam extending between the spaced apart supports, a contact cross bar located on the movable beam, the contact cross bar facing the first pair of contacts, means for deflecting the movable beam towards the first pair of contacts on the substrate, and means for bringing the cross bar in physical contact with the first pair of contracts.

According to a second aspect of the invention, there is provided a microelectromechanical relay. The relay includes a substrate having a trench formed therein. A first pair of contacts is located in the trench of the substrate and a microelectromechanical actuator is located on the substrate for controllably establishing electrical contact between the first pair of contacts on the substrate. The actuator includes spaced apart supports on the substrate, a movable beam extending between the spaced apart supports, a contact cross bar located on the movable beam, the contact cross bar facing the first pair of contacts, means for generating an electromagnetic (Lorentz) force on the movable beam to deflect the beam towards the substrate, and means for generating an electrostatic force between the beam and the substrate so that the contact cross bar is brought into physical contact with the first pair of contacts.

According to a third aspect of the invention, there is provided a microrelay that includes a first electrode located on the movable beam and a second electrode located on the substrate. The first electrode is at a different potential than the second electrode so that when the first and second electrodes are brought into close proximity to one another, an electrostatic force is generated therebetween to bring the contact cross bar in contact with the first pair of electrodes. Also included are current carrying coils located in the movable beam wherein when the relay is placed in a permanent magnetic field, an electromagnetic force is exerted on the movable beam to deflect the beam towards the pair of contacts close enough so that the electrostatic force takes over.

According to a fourth aspect of the invention, there is provided a method of fabricating a microelectromechanical relay. The method includes the steps of:

(a) etching a deep trench anisotropically into a silicon substrate;

(b) depositing an insulating film on the entire surface of the substrate;

(c) depositing a conductive film on the insulating film;

(d) etching away the conductive film deposited in step (c) to create a pair of contacts and an electrode in the deep trench;

(e) filling deep trench with a sacrificial material;

(f) polishing the substrate to create a flat surface;

(g) creating a beam layer over the deep trench; and (h) removing the sacrificial material.

DETAILED DESCRIPTION OF THE PREFERRED EMBODIMENTS OF THE PRESENT INVENTION

Figure 1:
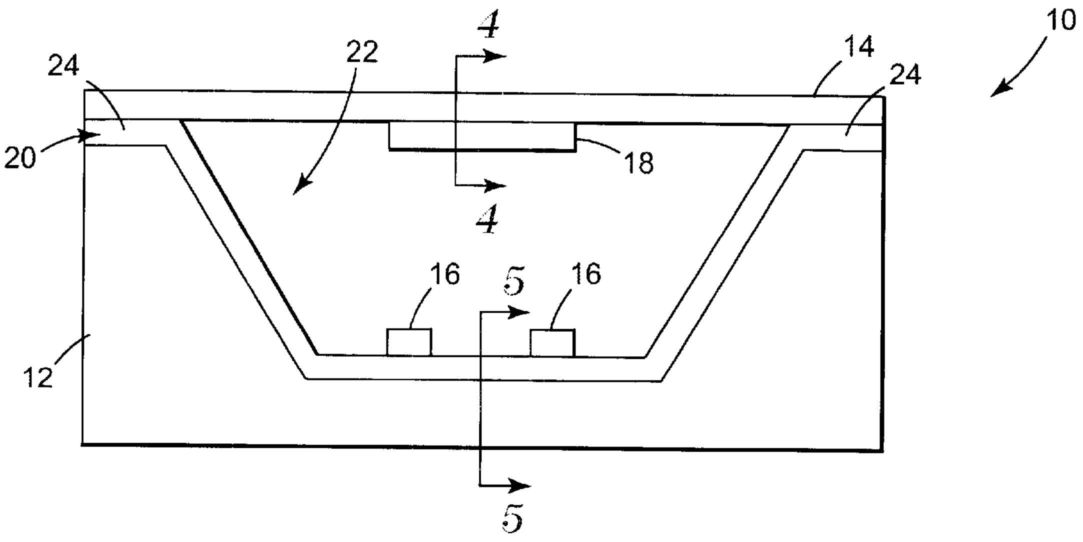
FIG. 1 is a cross sectional view of a MEMS relay according to a preferred embodiment of the present invention in an OFF state.
Figure 2:
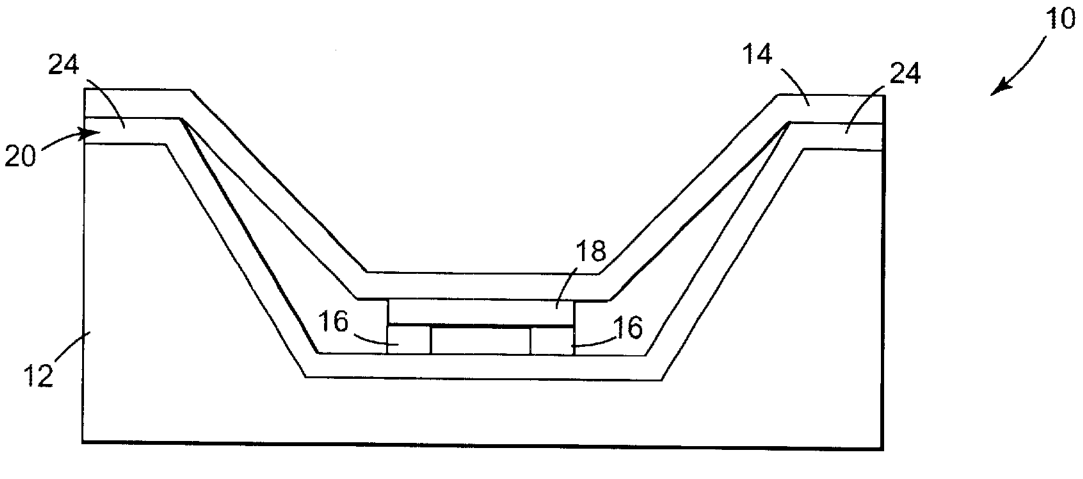
FIG. 2 is a cross sectional view of the MEMS relay shown in FIG. 1 in an ON state.

FIG. 1 is a cross-sectional view of a MEMS microrelay according to a preferred embodiment of the present invention. The microrelay 10 is shown in an OFF state. FIG. 2 is a cross-sectional view of the microrelay shown in FIG. 1 in an ON state. The microrelay 10 includes a substrate 12, a movable beam 14, contacts 16, a contact cross-bar 18 and an insulating layer 20 separating the contacts 6 from the substrate 12. Also included are an upper electrode (not shown) in the movable beam 14 and a lower electrode (not shown) located on the substrate 12. The upper and lower electrodes will be discussed in greater detail with reference to the views in FIGS. 4 and 5. The contacts 16 are isolated, conductive lines that are built in a trench 22 formed in the substrate 12. One of the contacts 16 is an input and the other is an output.

FIG. 2 is a cross-sectional view of the MEMS relay shown in FIG. 1 in an ON state. The relay 10 is switched "on" by electrically connecting the input and output lines, i.e., contacts 16, with a movable, conductive, contact member, namely contact cross-bar 18. The contact cross-bar 18 hangs directly over contacts 16 and is suspended on the movable beam 14. The movable beam 14 is fixed at each end by two spaced apart supports 24 formed on each side of trench 22.

Figure 3:
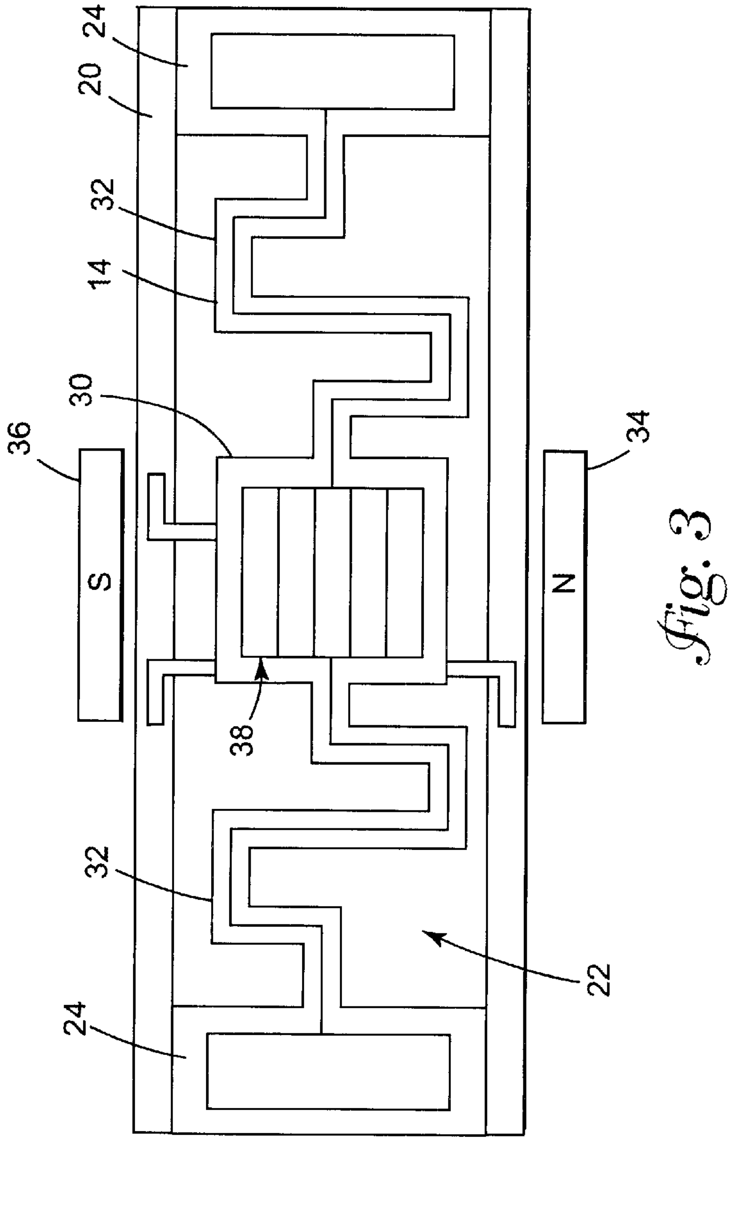
FIG. 3 is a top, planar view of a wafer on which a microrelay is constructed according to a preferred embodiment of the present invention.
Figure 6:
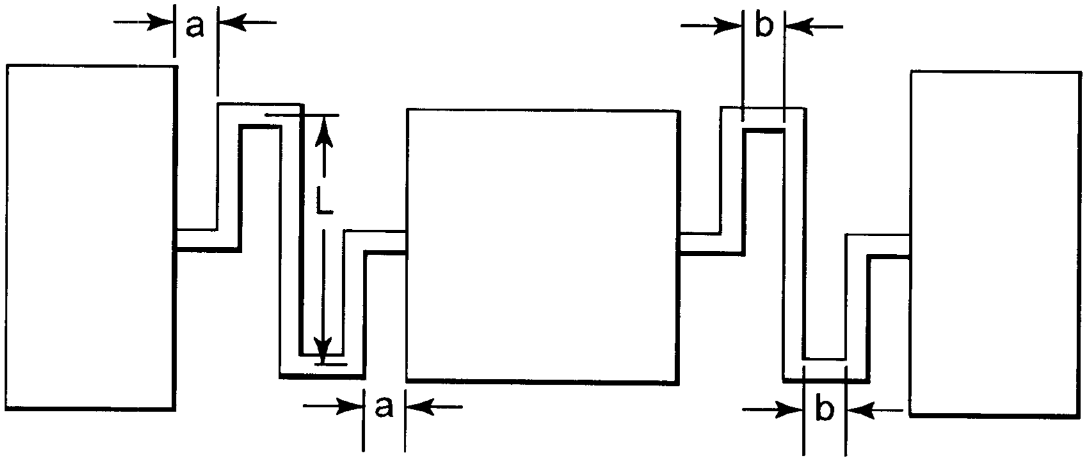
FIG. 6 is a top planar view of a movable beam according to the present invention.

FIG. 3 is a top view of a substrate having a microrelay formed thereon according to a preferred embodiment of the present invention. The movable beam 14 includes a diaphragm 30 on which the contact cross-bar (not shown) is located so that it is facing the substrate 12 and folded spring arms 32 extending from the diaphragm 30 and coupling the diaphragm to the spaced apart supports 24. In this preferred embodiment, the diaphragm 30 is shown as a square but it may have other shapes such as a rectangle or triangle. If the diaphragm is triangular in shape, as shown in FIG. 6, three folded spring arms are needed as will be described hereinafter. The microrelay 10 is placed between the north and south poles, 34, 36 of a permanent magnet. The movable beam 14 in the diaphragm region 30 has current coils 38 running on the top surface of the beam. The current coils are coupled to a source of current (not shown).

Relay transition from the "OFF" state to the "ON" state is accomplished using a two-stage actuation technique. In the first stage, the movable beam 14 is deflected to bring the contact cross-bar 18 closer to the contacts 16. In order to do this, an electromagnetic or Lorentz force is used. The electromagnetic force is generated by placing the entire device in an external magnetic field as shown in FIG. 3 and passing current through current coils 38 fabricated on the movable beam 14. Once the contact cross-bar 18 is brought close to contacts 16, the second stage of actuation is used, more particularly electrostatic actuation. Using electrostatic actuation, the contact cross-bar 18 is brought into physical contact with contacts 16. It is important to have a high contact force so that a stable "ON" state with low contact resistance is achieved. The electrostatic force is generated by two electrodes, one fabricated on the movable beam 14 and the other built within trench 22, where the electrodes are held at different potentials.

Figure 4:
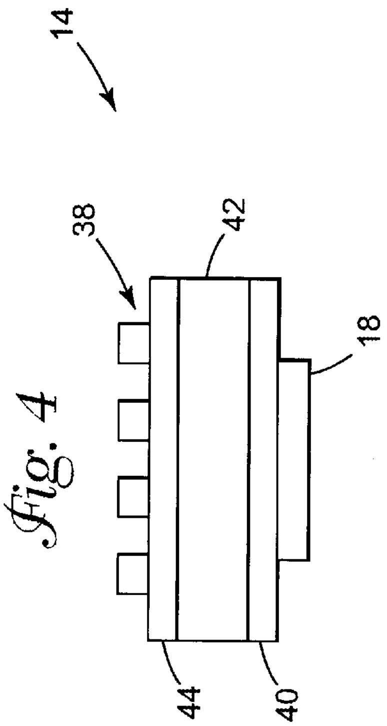
FIG. 4 is a cross sectional view of the relay shown in FIG. 1 taken along lines 4—4.

FIG. 4 is a cross-sectional view of the microrelay shown in FIG. 1 taken along lines 4—4. The movable beam 14 is made up of the following five layers, starting with the layer closest to the substrate, a first conductive layer 18, a first insulative layer 40, a second conductive layer 42, a second insulative layer 44, and a third conductive layer 38. The first conductive layer 18 forms the contact cross-bar, the second conductive layer 42 forms the upper electrode and the third conductive layer 38 forms the current coil. The first and second insulative layers 40, 44 isolate the contact crossbar 18, electrode 42 and current coils 38 from one another.

Figure 5:
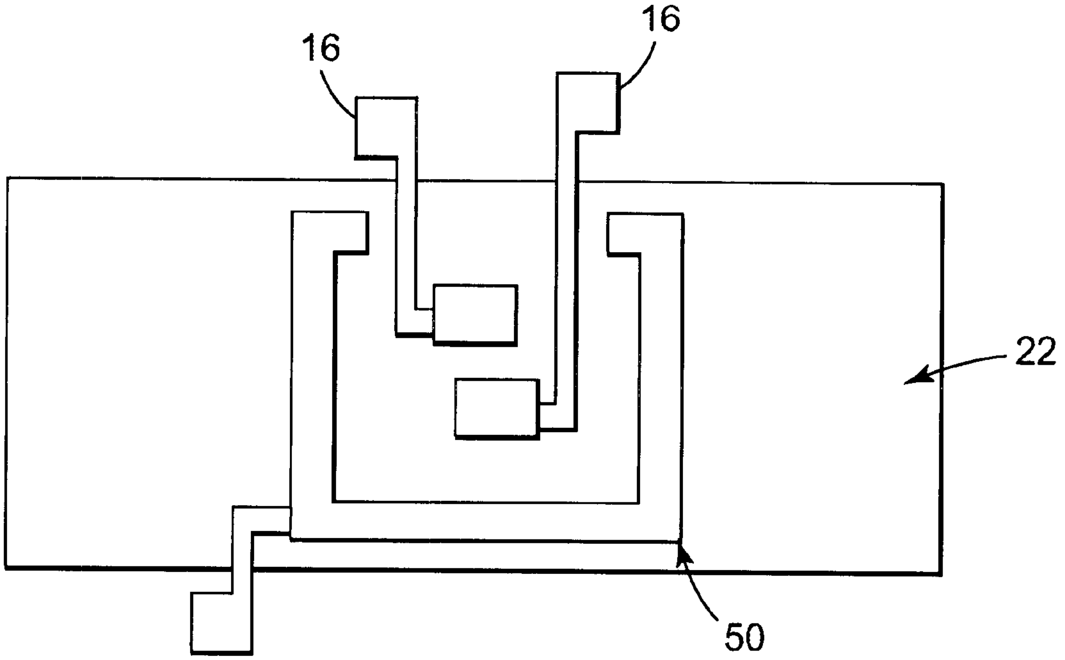
FIG. 5 is a top view of the lower electrode and contacts of the relay shown in FIG. 1.

FIG. 5 is a top view of the lower electrode and contacts of the relay shown in FIG. 1 (the movable beam not shown). The lower electrode 50 is located around the contacts 16 and the electrode as well as the contacts are built within trench 22 on top of insulating film 20.

FIG. 6 is a top planar view of a movable beam according to a preferred embodiment of the present invention. The movable beam 14 has an overall length $L_0$ of about 3 mm and an overall width $W_0$ of about 0.8 mm. Parameter a is about 0.215 mm, parameter b is about 0.215 mm and parameter L is about 0.8 mm. Of course, those of ordinary skill in the art will appreciate that other dimensions may be used and the claimed invention is not limited to the preferred embodiments illustrated.

Figure 7:
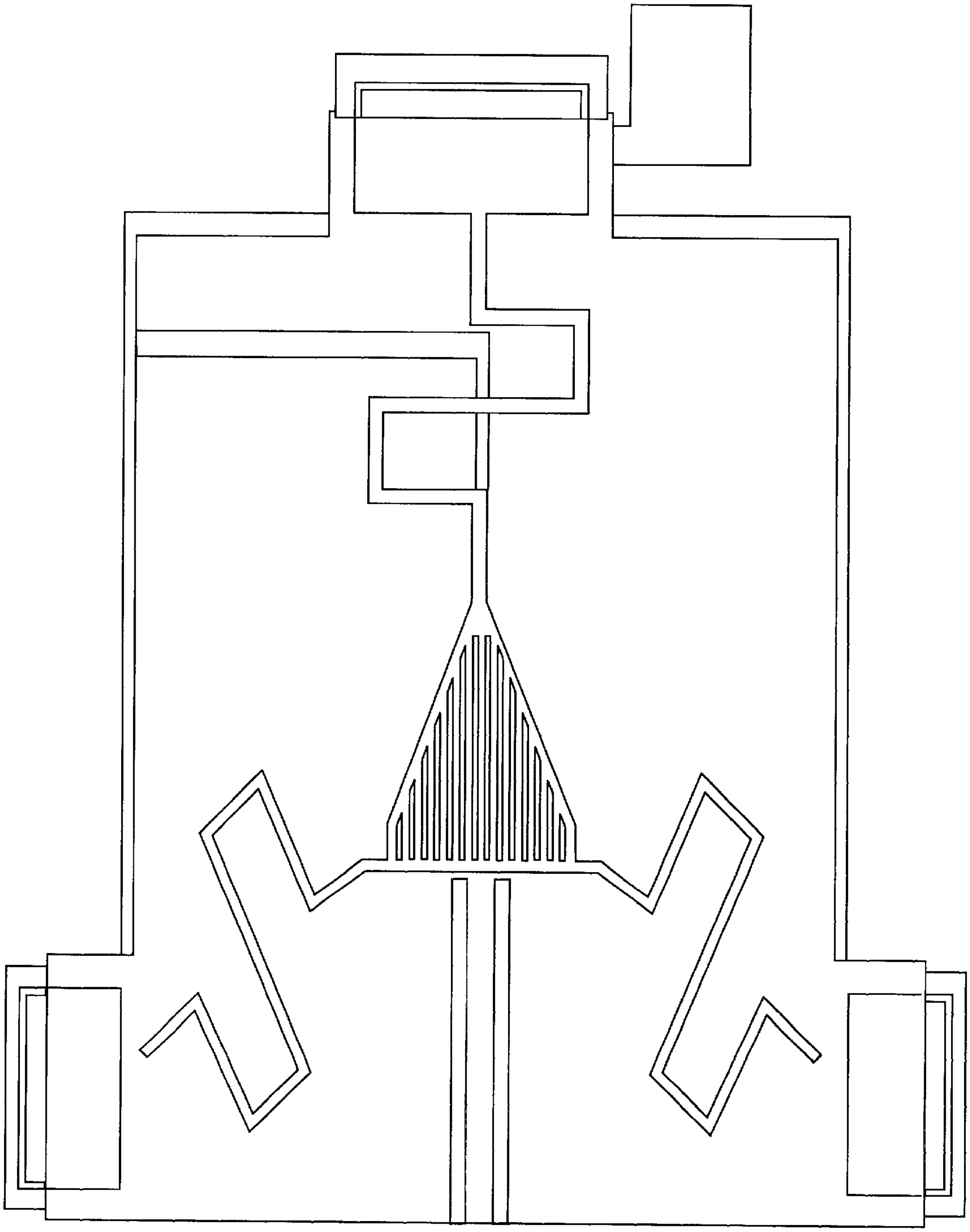
FIG. 7 is a top planar view of a wafer on which a microrelay according to a preferred embodiment is formed.

FIG. 7 is a top planar view of a microrelay 100 according to another preferred embodiment of the present invention. The microrelay has a triangular diaphragm region 110 and three spring arms. In both microrelays shown in FIGS. 1 and 7 the shape and dimensions of the springs are optimized to provide the deflection required to bring the contact cross-bar closer to the contacts with smaller electromagnetic forces. Another interesting characteristic of this design is that the bending of the movable beam in the diaphragm region is minimal. This keeps the upper electrode parallel to the lower electrode even at large beam deflections, thereby increasing electrostatic force. Also, making the lower electrode surround the contacts results in a more effective and uniform transmission of the electrostatic force onto the contacts.

Figure 8:
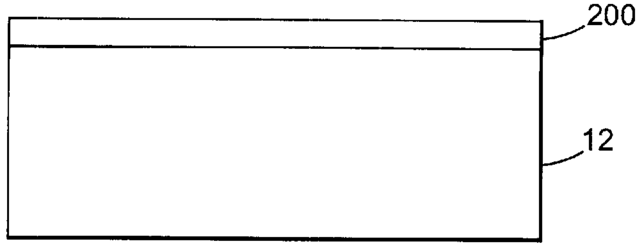
FIGS. 8–22 illustrate the processing step of forming a MEMS relay according to a preferred embodiment of the present invention.
Figure 9:
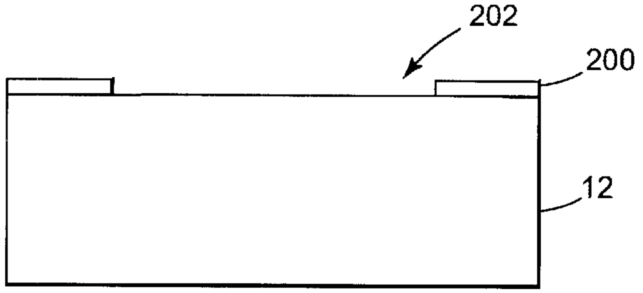
Figure 10:
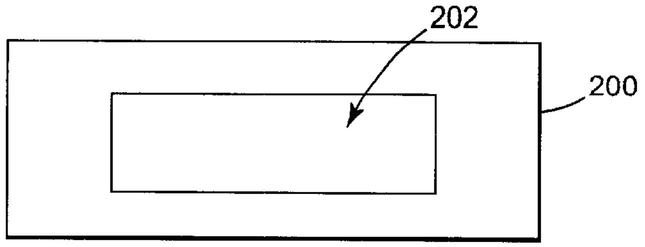
Figure 11:
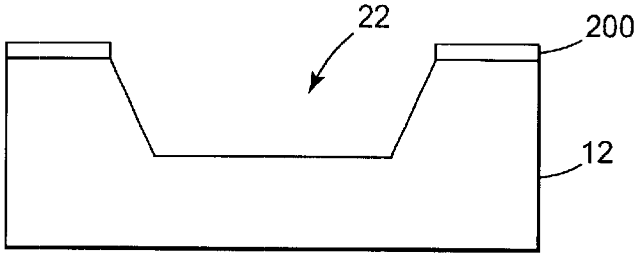
Figure 12:
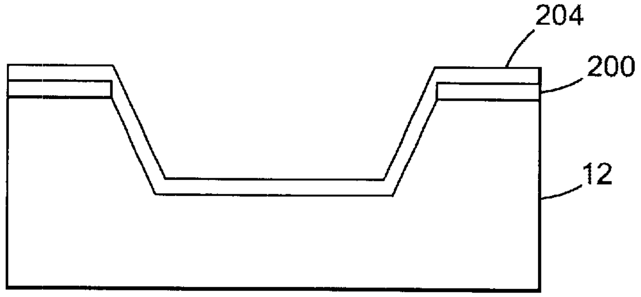

FIGS. 8–22 illustrate the microfabrication processing steps used to create a microrelay according to the preferred embodiments of the present invention. In FIG. 8, which is a cross-sectional view, the substrate 12 which in a preferred embodiment is silicon has a layer of nitride 200 deposited thereon using low pressure chemical vapor deposition (LPCVD) techniques. Preferably layer 200 is deposited to a thickness of about 1000 Å. Next, as shown in the cross-sectional view of FIG. 9, a reactive ion etch (RIE) is performed on the nitride layer 200 to form an opening 202 for the trench (see FIG. 1). FIG. 10 shows a top plan view of the wafer shown in FIG. 9. Next, as shown in the cross-sectional view of FIG. 11 an anisotropic KOH etch is formed to create the trench. In a preferred embodiment the trench is about 12 microns deep. In the cross-sectional view of FIG. 12 a layer of nitride 204 is deposited using LPCVD to a thickness of about 1000 Å. Nitride layer 204 forms an insulation layer.

Figure 13:
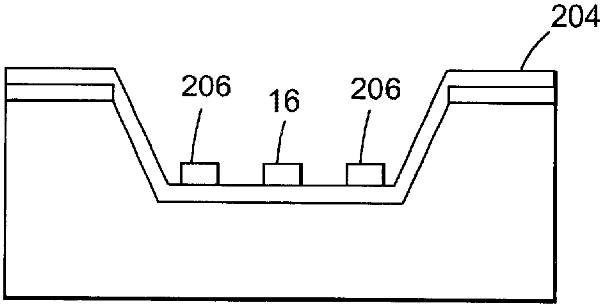
Figure 14:
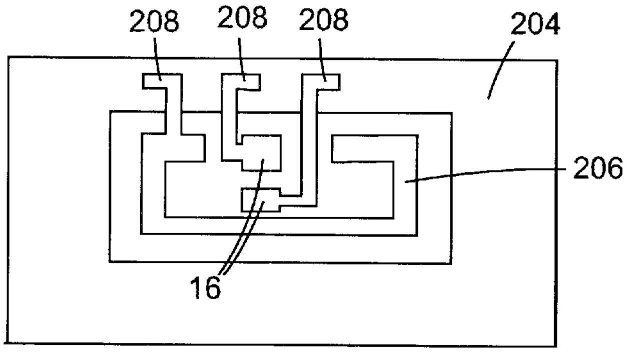
Figure 15:
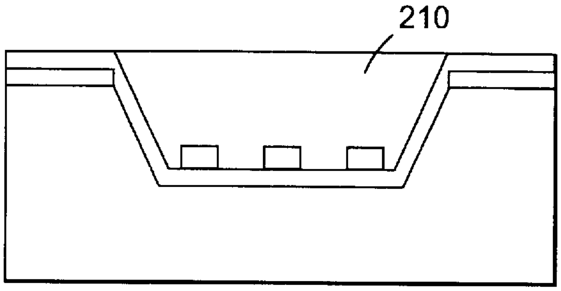
Figure 16:
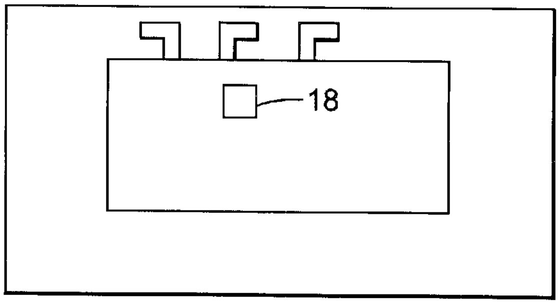
Figure 17:
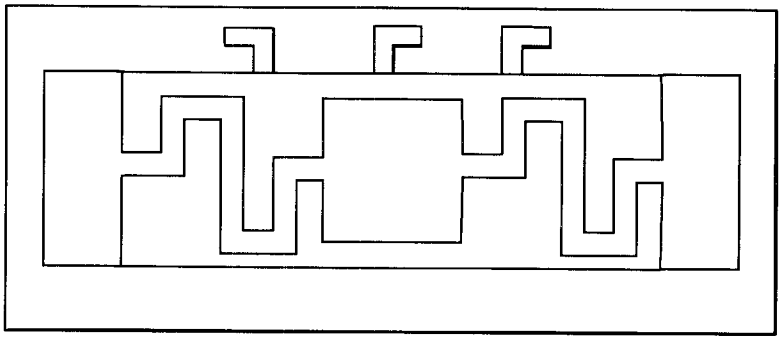
Figure 18:
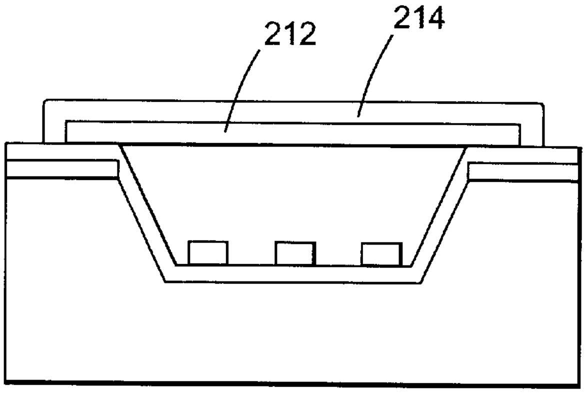
Figure 19:
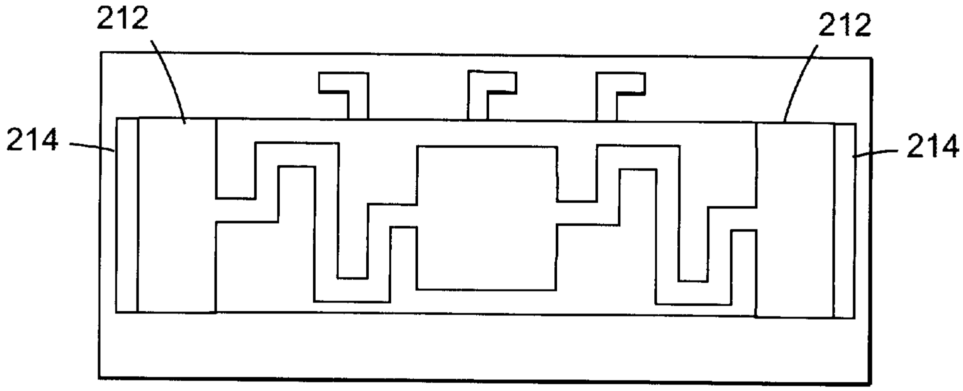
Figure 20:
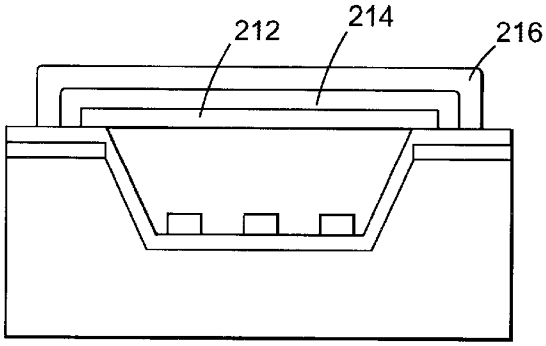
Figure 21:
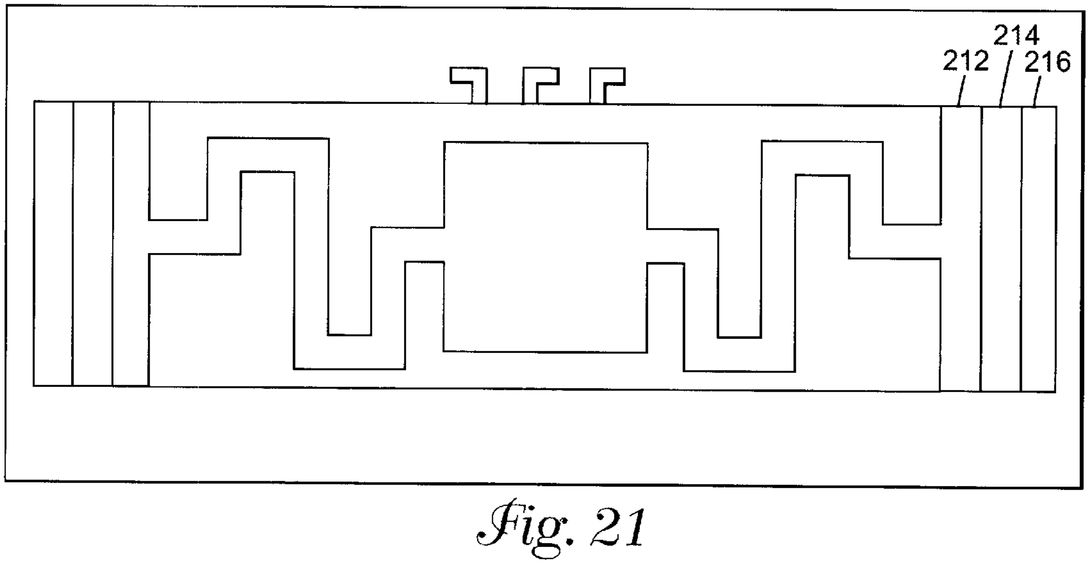
Figure 22:
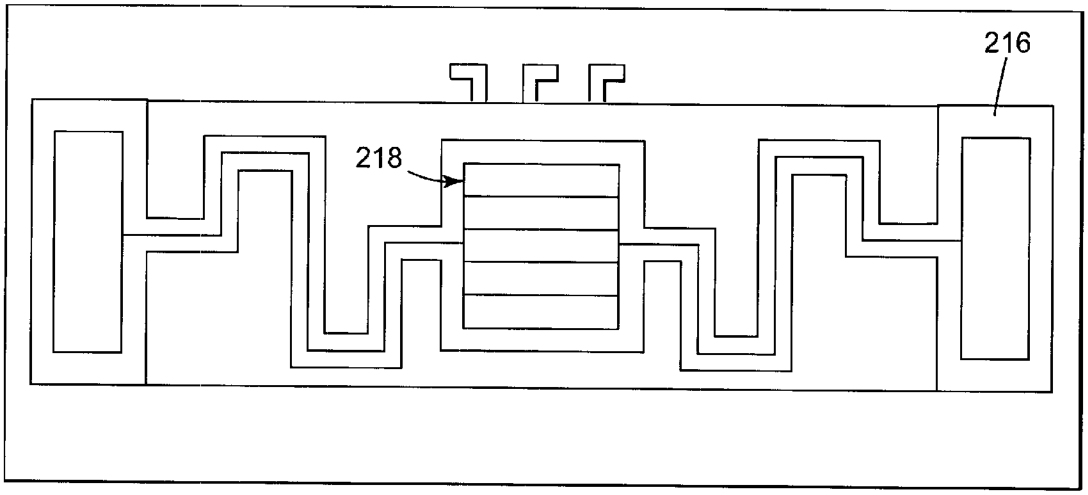

Next the lower electrode and contacts are created in the nitride layer 204. FIGS. 13 and 14 are cross-sectional and top plan views respectively of this processing step. About 1 micron of gold is sputtered and then patterned to form the contacts 16 and lower electrode 206. It can be seen that contacts pads 208 extend to a side of the wafer where the electrode 206 can be electrically coupled to a voltage source and contacts 16 can be coupled to in and out terminals. Next, in the cross-sectional view of FIG. 15 polyimide 210 is spun-on, cured, polished and etched back using an oxygen plasma etch so that the polyimide 210 fills the trench.

Now the movable beam can be created. As shown in the top plan view FIG. 16, the contact cross-bar 18 is created by electroplating gold onto the polyimide 210. Preferably the contact cross-bar 18 is about 1 micron thick. As shown in the top view of FIG. 17, a layer of nitride is then sputtered and etched using RIE to define the diaphragm and folded spring arms of the movable beam. Then, as shown in the cross-sectional and top views of FIGS. 18 and 19, gold is electroplated over the nitride layer 212 to form the upper electrode 214. Preferably the upper electrode has a thickness of about 5 microns. A layer of nitride 216, shown in FIGS.

20 and 21, is then sputtered and etched using an RIE over the upper electrode. Then, as shown in the top plan view of FIG. 22, gold is electroplated on the nitride layer to form the current coils 218. Preferably the current coils have a thickness of about 1 micron. Finally, a wet chemical etch with a solution of sulphuric acid hydrogen peroxide is performed to selectively remove the sacrificial polyimide and release portions of the beam.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A microelectromechanical relay comprising:

a substrate layer having a trench formed therein;

a first pair of contacts located in the trench of the substrate;

a microelectromechanical actuator on the substrate for controllably establishing electrical contact between the first pair of contacts on the substrate, the actuator comprising:

spaced apart supports on the substrate;

a movable beam extending between the spaced apart supports;

a contact cross bar located on the movable beam, the contact cross bar facing the first pair of contacts;

means for deflecting the movable beam towards the first pair of contacts on the substrate; and means for bringing the cross bar in physical contact with the first pair of contacts.

2. The relay of claim 1 wherein the means for deflecting the movable beam comprise current carrying coils on the movable beam and a permanent magnetic field in which the relay is placed so that an electromagnetic force is exerted on the movable beam.

3. The relay of claim 1 wherein the means for bringing the cross bar in physical contact with the pair of electrodes comprises a first electrode located on the movable beam and a second electrode located on the substrate wherein the first electrode is at a different potential than the second electrode so that an electrostatic force is exerted on the movable beam.

4. The relay of claim 3 wherein the movable beam comprises the following five layers starting with a layer closest to the substrate, a first conductive film which forms the contact cross bar, an insulating film, a second conductive film that forms the first electrode, an insulating film and a third conductive film that forms current coils.

5. The relay of claim 1 wherein the contact cross bar is square in shape.

6. The relay of claim 1 wherein the contact cross bar is triangular in shape.

7. A microelectromechanical relay comprising:

a substrate having a trench formed therein;

a first pair of contacts located in the trench of the substrate;

a microelectromechanical actuator on the substrate for controllably establishing electrical contact between the first pair of contacts on the substrate, the actuator comprising:

spaced apart supports on the substrate;

a movable beam extending between the spaced apart supports;

a contact cross bar located on the movable beam, the contact cross bar facing the first pair of contacts;

means for generating an electromechanical force on the movable beam to deflect the beam towards the substrate; and means for generating an electrostatic force between the beam and the substrate so that the contact cross bar is brought into physical contact with the first pair of contacts.

8. A microrelay comprising:

a substrate layer having a trench formed therein;

a first pair of contacts located in the trench of the substrate;

a microelectromechanical actuator on the substrate for a controllably establishing electrical contact between the first pair of contacts on the substrate, the actuator comprising:

spaced apart supports on the substrate;

a movable beam extending between the spaced apart supports;

a contact cross bar located on the movable beam, the contact cross bar facing the first pair of contacts;

a first electrode located on the movable beam;

a second electrode located on the substrate, wherein the first electrode is at a different potential than the second electrode so that when the first and second electrodes are brought into close proximity to one another, an electrostatic force exists therebetween to bring the contact cross bar in contact with the first pair of contacts; and current carrying coils located in the movable beam wherein when the relay is placed in a permanent magnetic field, an electromagnetic force is exerted on the movable beam to deflect the beam towards the pair of contacts close enough so that the electrostatic force takes over.

9. The relay of claim 1 wherein the actuator comprises two spaced apart supports and the movable beam has a central area and two spring arms extending from the central area with each spring arm coupled to an individual support.

10. The relay of claim 1 wherein the actuator comprises three spaced apart supports and the movable beam has a central area and three spring arms extending from the central area with each spring arm coupled to an individual support.

11. The relay of claim 10 wherein the central area is triangular in shape.

12. The relay of claim 9 wherein the central area is rectangular in shape.

13. The relay of claim 9 wherein the central area is square in shape.

14. The relay of claim 1 wherein the second electrode surrounds the contacts.

15. A microelectromechanical relay comprising:

a substrate layer;

a first pair of contacts located on the substrate;

a microelectromechanical actuator on the substrate for controllably establishing electrical contact between the first pair of contacts on the substrate, the actuator comprising:

spaced apart supports on the substrate;

a movable beam extending between the spaced apart supports;

a contact cross bar located on the movable beam, the contact cross bar facing the first pair of contacts;

an electromagnetic device configured and arranged to generate an electromagnetic force between the movable beam and the substrate to deflect the movable beam towards the first pair of contacts on the substrate; and an electrostatic device configured and arranged to generate a electrostatic force between the beam and the substrate to bring the cross bar in physical contact with the first pair of contacts.

16. The relay of claim 15 wherein the electromagnetic device comprises a conductive layer on the movable beam and a permanent magnetic field in which the relay is situated so that an electromagnetic force is exerted on the movable beam when current passes through the conductive layer.

17. The relay of claim 16 wherein the conductive layer comprises a coil structure.

18. The relay of claim 15 wherein the electrostatic device comprises a fist electrode located on the movable beam and a second electrode located on the substrate, wherein the first electrode is at a different potential than the second electrode so that an electrostatic force is exerted on the movable beam.

19. The relay of claim 18 wherein the second electrode on the substrate substantially surrounds the contacts.

20. The relay of claim 18 wherein the movable beam comprises the following five layers starting with a layer closest to the substrate, a first conductive layer which forms the contact cross bar, an insulating layer, a second conductive layer that forms the first electrode, an insulating layer and a third conductive layer that is used to generate the electromagnetic force.

21. The relay of claim 15 wherein the spaced apart supports define a trench in the substrate, wherein the first pair of contacts are located in the trench.

22. The relay of claim 15 wherein the contact cross bar is square in shape.

23. The relay of claim 15 wherein when the movable beam and the substrate are brought into close proximity to one another, an electrostatic force exists therebetween to bring the contact cross bar in contact with the first pair of contacts; and wherein when the relay is placed in a permanent magnetic field, an electromagnetic force is exerted on the movable beam to deflect the beam towards the pair of contacts close enough so that the electrostatic force takes over.

24. The relay of claim 15 wherein the movable beam has a central area and two spring arms extending from the central area with each spring arm coupled to one of the spaced apart supports on the substrate.

25. The relay of claim 24 wherein the central area is rectangular in shape.

26. The relay of claim 24 wherein the central area is square in shape.

* * * * *

UNITED STATES PATENT AND TRADEMARK OFFICE

CERTIFICATE OF CORRECTION

PATENT NO. : 6,635,837 B2
DATED : October 21, 2003
INVENTOR(S) : Subramanian et al.

It is certified that error appears in the above-identified patent and that said Letters Patent is hereby corrected as shown below:

Title page,
Item [56], References Cited, OTHER PUBLICATIONS: In the Drake reference, please delete "pp. 380-496,"

Column 3,
Line 64, "crossbar" should read -- cross-bar --

Column 7,
Line 2, "erate a electrostatic" should read -- erate an electrostatic --
Line 13, "comprises a fist electrode" should read -- comprises a first electrode --

Signed and Sealed this

Twenty-fourth Day of February, 2004

JON W. DUDAS
*Acting Director of the United States Patent and Trademark Office*